United States Patent
Hu et al.

(10) Patent No.: US 7,495,391 B2
(45) Date of Patent: Feb. 24, 2009

(54) ORGANIC ELECTROLUMINESCENCE DEVICE AND ORGANIC ELECTROLUMINESCENCE PANEL USING THE SAME

(75) Inventors: Min-Chieh Hu, Shanhua Township, Tainan County (TW); Min-Ling Hung, Kanding Township, Pingtung County (TW)

(73) Assignee: AU Optronics Corp., Hsin-Chu (TW)

( * ) Notice: Subject to any disclaimer, the term of this patent is extended or adjusted under 35 U.S.C. 154(b) by 0 days.

(21) Appl. No.: 11/525,870

(22) Filed: Sep. 25, 2006

(65) Prior Publication Data

US 2007/0278950 A1    Dec. 6, 2007

(30) Foreign Application Priority Data

Jun. 5, 2006    (TW) ............... 95119834 A

(51) Int. Cl.
    *H05B 33/02* (2006.01)
(52) U.S. Cl. .................. 313/512; 313/504; 313/503
(58) Field of Classification Search ......... 313/498–512; 315/169.3; 428/690, 917
    See application file for complete search history.

(56) References Cited

U.S. PATENT DOCUMENTS

| | | | |
|---|---|---|---|
| 6,563,263 B1 | 5/2003 | Kawaguchi et al. | |
| 6,660,409 B1 | 12/2003 | Komatsu et al. | |
| 6,731,064 B2 | 5/2004 | Andry et al. | |
| 6,835,950 B2 * | 12/2004 | Brown et al. | 257/40 |
| 6,882,104 B2 | 4/2005 | Miwa et al. | |
| 6,977,391 B2 | 12/2005 | Frischknecht | |
| 2003/0098648 A1 | 5/2003 | Miwa et al. | |
| 2004/0232832 A1 * | 11/2004 | Kubota | 313/512 |
| 2004/0245917 A1 | 12/2004 | Lu et al. | |
| 2005/0023965 A1 * | 2/2005 | Maeda et al. | 313/504 |
| 2007/0085477 A1 * | 4/2007 | Kubota | 313/512 |
| 2007/0132375 A1 * | 6/2007 | Bachmann et al. | 313/505 |

FOREIGN PATENT DOCUMENTS

| | | |
|---|---|---|
| JP | 10-275680 | 10/1998 |
| JP | 2003-381403 | * 8/2004 |

\* cited by examiner

*Primary Examiner*—Bao Q Truong
(74) *Attorney, Agent, or Firm*—Rabin & Berdo, PC

(57) ABSTRACT

An organic electroluminescence device (OELD) and a display panel are provided. The OELD comprises a first electrode, a second electrode, an emissive layer and a shielding structure. The second electrode is disposed above the first electrode. The emissive layer is disposed between the first electrode and the second electrode. The shielding structure is disposed above the second electrode. The hardness of the shielding structure is smaller than that of the second electrode.

24 Claims, 3 Drawing Sheets

ORGANIC ELECTROLUMINESCENCE DEVICE AND ORGANIC ELECTROLUMINESCENCE PANEL USING THE SAME

This application claims the benefit of Taiwan Patent Application Serial No.95119834, filed Jun. 5, 2006, the subject matter of which is incorporated herein by reference.

BACKGROUND OF THE INVENTION

1. Field of the Invention

The invention relates in general to an organic electroluminescence device (OELD) and an organic electroluminescence (OEL) panel using the same, and more particularly to an OELD having a shielding structure on the electrode and an OEL panel using the same. The hardness of the shielding structure is approximately smaller than or equal to the hardness of the electrode.

2. Description of the Related Art

The OEL panel having the advantages of light weight, thinness, high contrast, power saving, high color saturation, and fast response has become a display with great potential. Both the manufacturing process and the structure of an organic electroluminescence device (OELD) are simpler than that of other display devices such as cathode ray tube (CRT) display and liquid crystal display (LCD). Moreover, the OEL panel is self-illuminant, free of view-angle restriction and can be incorporated with flexible substrate. Therefore, the OEL panel is applicable to a large variety of products related to display devices.

Referring to FIG. 1, a diagram of a conventional OEL panel is shown. As shown in FIG. 1, the OEL panel 1 comprises a substrate 10, a top cover 11 and an OELD 12. The top cover 11 is disposed on the substrate 10. The OELD 12 is disposed on the substrate 10 and positioned between the top cover 11 and the substrate 10. The top cover 11 and the substrate 10 are bonded by a sealant S.

The OEL panel 1 further comprises an absorbent layer 13. The absorbent layer 13 is disposed on the top cover 11 and positioned between the top cover 11 and the OELD 12. Due to the fragile structure of the OELD 12, if the top cover 11 or the substrate 10 is bent or deformed during the packaging process or back-end process of the OEL panel 1, the OELD 12 would easily be pressed and damaged. Meanwhile, since the absorbent layer 13 is a drying agent, the generated particles P would alight on the surface or the adjacent side of the OELD 12. When the top cover 11 is squeezed or twisted, the particles P would easily scratch or press the OELD 12 if the particles P are squeezed by the top cover 11. Due to the structure design and physical characteristics of the OEL panel, if particle problem occurs to the display panel, the illuminant element would be pressed and damaged easily, affecting the yield rate and reliability of the product.

SUMMARY OF THE INVENTION

It is therefore an object of the invention to provide an organic electroluminescence device (OELD) and an OEL panel using the same. A shielding structure is formed on the electrode of the OELD. The hardness of the shielding structure is smaller than the hardness of the electrode.

The invention achieves the above-identified object by providing an organic electroluminescence device (OELD). The OELD comprises a first electrode, a second electrode, an emissive layer and a shielding structure. The second electrode is disposed above the first electrode. The emissive layer is disposed between the first electrode and the second electrode. The shielding structure is disposed on the second electrode. The hardness of the shielding structure is smaller than the hardness of the second electrode.

The invention achieves the above-identified object by providing an organic electroluminescence (OEL) panel. The OEL panel comprises a substrate, a top cover and an OELD. The top cover is disposed above the substrate. The OELD is disposed on the substrate and positioned between the top cover and the substrate. The OELD comprises a first electrode, a second electrode, an emissive layer and a shielding structure. The second electrode is disposed above the first electrode. The emissive layer is disposed between the first electrode and the second electrode. The shielding structure is disposed on the second electrode. The hardness of the shielding structure is smaller than the hardness of the second electrode.

Other objects, features, and advantages of the invention will become apparent from the following detailed description of the preferred but non-limiting embodiments. The following description is made with reference to the accompanying drawings.

DETAILED DESCRIPTION OF THE INVENTION

First Embodiment

Figure 1:
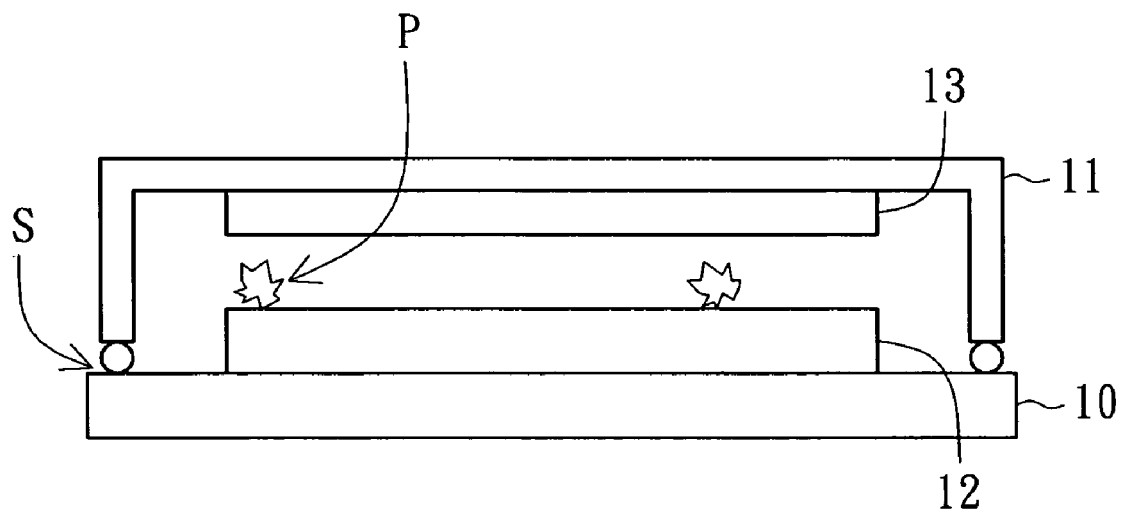
FIG. 1 (Related Art) is a diagram of a conventional OEL panel.
Figure 2:
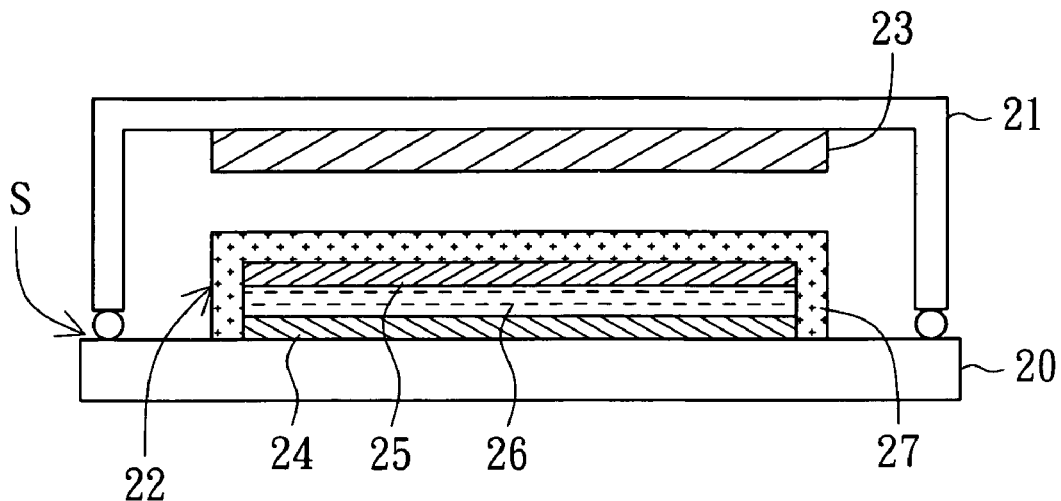
FIG. 2 is a first diagram of an OEL panel according to a first embodiment of the invention.

Referring to FIG. 2, a first diagram of an OEL panel according to a first embodiment of the invention is shown. As shown in FIG. 2, the OEL panel 2 mainly comprises a substrate 20, a top cover 21 and an OELD 22. The top cover 21 is disposed on the substrate 20. The OELD 22 is disposed on the substrate 20 and positioned between the top cover 21 and the substrate 20. The OELD 22 comprises a first electrode 24, a second electrode 25, an emissive layer 26 and a shielding structure 27. The second electrode 25 is disposed above the first electrode 24. The emissive layer 26 is disposed between the first electrode 24 and the second electrode 25. The shielding structure 27 is disposed on the second electrode 25 as a buffer layer in order to protect the OELD from being scratched or damaged by particles. The hardness of the shielding structure 27 is smaller than the hardness of the second electrode 25. The yield rate of the OEL panel can be improved.

A sealant S is filled between the top cover 21 and the substrate 20 and pasted on the top cover 21 for bonding and packaging the top cover 21 and the substrate 20 after the top cover 21 and the substrate 20 are aligned and matched. The OEL panel 2 further comprises an absorbent layer 23 disposed on the top cover 21 and positioned between the top cover 21 and the OELD 22. The absorbent layer 23 is formed on the top cover 21 by adhering, pasting, or electroplating.

The cross-section of the top cover 21 is an inverted U-shaped cross-section such that the absorbent layer 23 is received in the inverted U-shaped recess.

The first electrode 24 and the second electrode 25 are respectively an anode and a cathode, or a cathode and an anode. Since the shielding structure 27 is disposed on the second electrode 25, the hardness of the shielding structure 27 is approximately smaller than or equal to the hardness of the second electrode 25 such that the shielding structure 27 is used as a buffer layer to protect the second electrode 25. Preferably, the Mohs' hardness of the shielding structure 27 is smaller than about 4, and the thickness of the shielding structure 27 approximately ranges between 0.2 μm and 100 μm. Ideally, the thickness of the shielding structure 27 is approximately equal to 3 μm.

Figure 3:
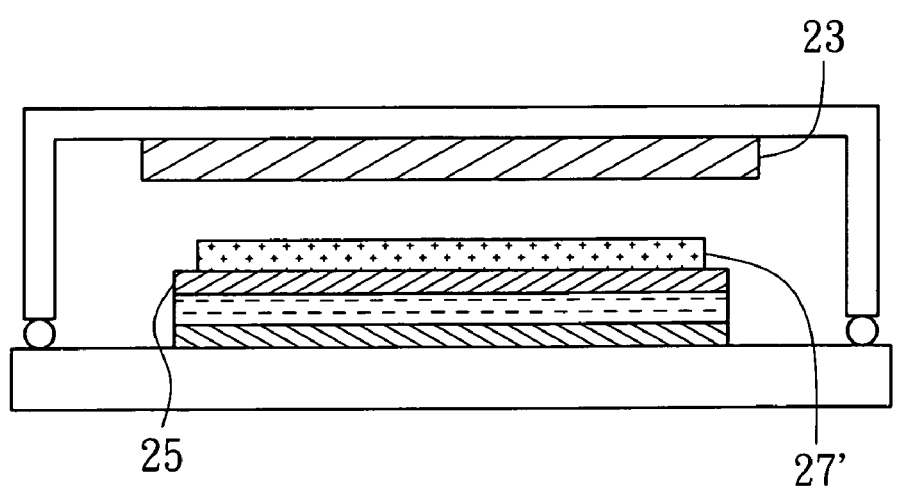
FIG. 3 is a second diagram of an OEL panel according to a first embodiment of the invention.

Referring to FIG. 3, a second diagram of an OEL panel according to a first embodiment of the invention is shown. As shown in FIG. 3, the shielding structure 27' only covers a part of the second electrode 25. That is, the area covered by the shielding structure 27' is smaller than the area of the top surface of the second electrode 25. Besides, the area covered by the shielding structure 27' can be designed as being equal to or larger than the area of the top surface of the second electrode 25.

Similarly, the area covered by the shielding structure 27 can be larger than, equal to or smaller than the area of the bottom surface of the absorbent layer 23 such that the OELD 22 is effectively protected and the particles are prevented from alighting on the top surface of the OELD 22, lest the particles might press and damage the OELD 22 when the top cover 21 or the substrate 20 is bent, twisted or deformed. Thus, the OELD 22 is still well protected when the particles alight on the OELD 22.

The shielding structure 27 can be made from an organic material or an inorganic material. When the second electrode 25 is made from indium tin oxide (ITO), the material of the shielding structure 27 may include aluminum. Since the Mohs' hardness of the ITO is 4 and the Mohs' hardness of aluminum is 3, the shielding structure 27 made from aluminum is capable of effectively protecting the second electrode 25 without scratching the surface of the second electrode 25. The shielding structure 27 can also be made from copper phthalocyanine (CuPC), 8-tris-hydroquinoline-aluminum (Alq3) or triphenylamine derivative (TPD).

The substrate 20 can be an active substrate or a passive substrate. Meanwhile, the material of the substrate 20 may include an organic material or an inorganic material.

The manufacturing process of the OEL panel 2 is disclosed below. Firstly, the OELD 22 is manufactured on the substrate 20. The first electrode 24, the emissive layer 26 and the second electrode 25 are sequentially formed on the substrate 20. Next, the shielding structure 27 exemplified by an organic thick film is formed on the second electrode 25 as a protection layer. The shielding structure 27 can be made from copper phthalocyanine (CuPC) or 8-tris-hydroquinoline-aluminum (Alq3). Then, the absorbent layer 23 is disposed on the top cover 21 by adhering, pasting or electroplating and the sealant S is pasted around the top cover 21 such that the top cover 21 is bounded and packaged with the substrate 20. The manufacturing process of the OEL panel 2 is completed.

With a shielding structure being disposed on the OELD as a protection layer, when particles are generated inside the OEL panel (for example, particles may come off the drying agent of the absorbent layer), the shielding structure prevents the particles from alighting on the surface of the OELD. When the OEL panel receives an external force (for example, when the OEL panel is squeezed or twisted), the particles are less likely to scratch or damage the surface of the OELD, hence improving the yield rate of the OEL panel.

Second Embodiment

Figure 4:
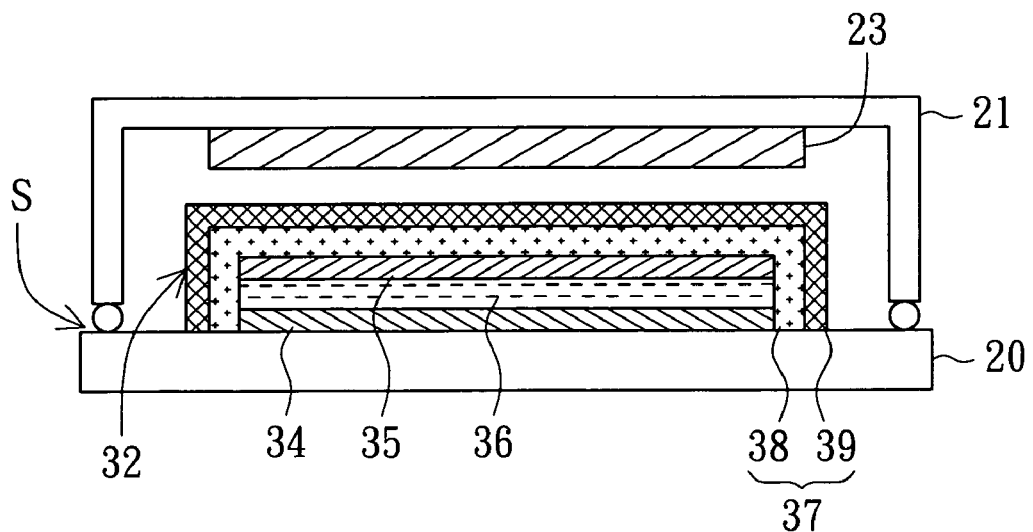
FIG. 4 a first diagram of an OEL panel according to a second embodiment of the invention.

Referring to FIG. 4, a first diagram of an OEL panel according to a second embodiment of the invention is shown. The OEL panel 3 of the present embodiment of the invention differs with the OEL panel 2 of the first embodiment in the elements of the OELD. As for other similar elements, the same reference numbers are used and are not repeated here. As shown in FIG. 4, the OELD 32 of the OEL panel 3 comprises a first electrode 34, a second electrode 35, an emissive layer 36 and a shielding structure 37. The emissive layer 36 is disposed between the first electrode 34 and the second electrode 35. The shielding structure 37 is disposed on the second electrode 35. The hardness of the shielding structure 37 is approximately smaller than or equal to the hardness of the second electrode 35.

In practical application, the shielding structure 37 may comprise several shielding layers, wherein the present embodiment of the invention is exemplified by having two shielding layers. In FIG. 4, the shielding structure 37 has a first shielding layer 38 and a second shielding layer 39. The first shielding layer 38 is positioned between the second shielding layer 39 and the second electrode 35. Preferably, the first shielding layer 38 completely covers the second electrode 35, and the second shielding layer 39 completely covers the first shielding layer 38, such that the first shielding layer 38 is completely enclosed in the second shielding layer 39.

Since the first shielding layer 38 is spread over the second electrode 35, the first shielding layer 38 has complete contact with the second electrode 35 and would not scratch the top surface of the second electrode 35. Preferably, the Mohs' hardness of the first shielding layer 38 is smaller than about 4.

The first shielding layer 38 can be made from an organic material or an inorganic material. Examples of the material of first shielding layer 38 include copper phthalocyanine (CuPC), 8-tris-hydroquinoline-aluminum (Alq$_3$) and triphenylamine derivative (TPD). The second shielding layer 39 can be made from Al$_2$O$_3$ or SiNx. Preferably, the thickness of the first shielding layer 38 is equal to about 2 μm but preferably more than about 3 μm. The thickness of the second shielding layer 39 is equal to about 5 μm.

Figure 5:
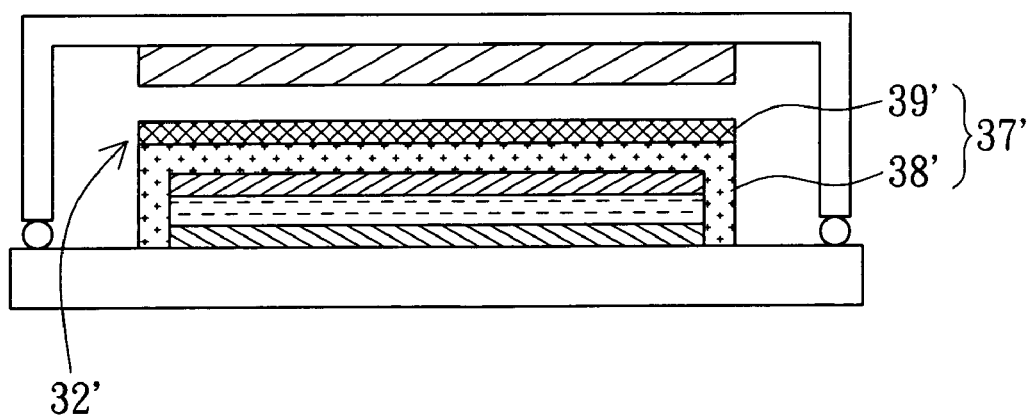
FIG. 5 is a second diagram of an OEL panel according to a second embodiment of the invention.

Referring to FIG. 5, a second diagram of an OEL panel according to a third embodiment of the invention is shown. As shown in FIG. 5, the shielding structure 37' of the OELD 32' comprises a first shielding layer 38' and a second shielding layer 39'. The second shielding layer 39' is disposed on the first shielding layer 38'. The second shielding layer 39' of FIG. 5 differs with the shielding structure 37 of FIG. 4 in that the second shielding layer 39' does not completely cover the first shielding layer 38', that is, the second shielding layer 39' only covers the top surface of the first shielding layer 38'. Preferably, the first shielding layer 38' completely covers the second electrode 35 such that the second electrode 35 is well protected.

The manufacturing process of the OEL panel 3 is disclosed below. Firstly, the first electrode 34, the emissive layer 36 and the second electrode 35 are sequentially formed on the substrate 20. Next, the first shielding layer 38 is formed on the second electrode 35 of the OELD 32. Examples of the first shielding layer 38 include an organic thick film made from CuPC. Then, the second shielding layer 39 is manufactured on the first shielding layer 38. Examples of the second shielding layer 39 include an aluminum layer. Next, the absorbent layer 23 is disposed on the top cover 21 by adhering, pasting or electroplating, and the sealant S is pasted around the top cover 21 such that the top cover 21 is bounded and packaged with the substrate 20. The manufacturing process of the OEL panel 3 is completed.

According to the OELD and the OEL panel using the same disclosed in the above embodiments of the invention, a shielding structure is formed on the electrode, such that the shielding structure completely covers the electrode to protect the electrode. Meanwhile, the hardness of the shielding structure is smaller than or equal to the hardness of the electrode of the OELD adjacent to the shielding structure to avoid damaging the electrode. The present embodiment of the invention uses the shielding structure with buffer function to prevent the OELD from being damaged by the particles when the top cover or the substrate is bent or deformed and squeezes the OELD during the packaging process and the back-end process of the OELD.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An organic electroluminescence device (OELD), comprising:
   a first electrode;
   a second electrode disposed on the first electrode;
   an emissive layer disposed between the first electrode and the second electrode; and
   a shielding structure disposed on the second electrode, wherein the hardness of the shielding structure is approximately smaller than or equal to the hardness of the second electrode.

2. The OELD according to claim 1, wherein the first electrode is an anode and the second electrode is a cathode.

3. The OELD according to claim 1, wherein the first electrode is a cathode and the second electrode is an anode.

4. The OELD according to claim 1, wherein the Mohs' hardness of the shielding structure is approximately smaller than 4.

5. The OELD according to claim 1, wherein the thickness of the shielding structure approximately ranges between 0.2μm and 100μm.

6. The OELD according to claim 1, wherein the thickness of the shielding structure is approximately equal to 5μm.

7. The OELD according to claim 1, wherein the shielding structure comprises a first shielding layer and a second shielding layer, and the first shielding layer is positioned between the second shielding layer and the second electrode.

8. The OELD according to claim 7, wherein the Mohs' hardness of the first shielding layer is approximately smaller than 4.

9. The OELD according to claim 7, wherein the first shielding layer is comprised of an organic material or an inorganic material.

10. The OELD according to claim 7, wherein the second electrode is comprised of indium tin oxide (ITO), and the material of the first shielding layer includes aluminum.

11. The OELD according to claim 7, wherein the material of the first shielding layer includes copper phthalocyanine (CuPC), 8-tris-hydroquinoline-aluminum ($Alq_3$) or triphenylamine derivative (TPD), and the material of the second shielding layer includes aluminum.

12. The OELD according to claim 11, wherein the thickness of the first shielding layer is approximately equal to 2μm.

13. An organic electroluminescence (OEL) panel, comprising:
    a substrate;
    a top cover disposed on the substrate; and
    an OELD disposed on the substrate and positioned between the top cover and the substrate, the OELD comprising:
    a first electrode;
    a second electrode disposed on the first electrode;
    an emissive layer disposed between the first electrode and the second electrode; and
    a shielding structure disposed on the second electrode, wherein the hardness of the shielding structure is approximately smaller than the hardness of the second electrode.

14. The OEL panel according to claim 13, further comprising:
    an absorbent layer disposed on the top cover and positioned between the top cover and the shielding structure.

15. The OEL panel according to claim 13, further comprising:
    a sealant disposed between the top cover and the substrate.

16. The OEL panel according to claim 13, wherein the first electrode is an anode and the second electrode is a cathode.

17. The OEL panel according to claim 13, wherein the first electrode is a cathode and the second electrode is an anode.

18. The OEL panel according to claim 13, wherein the Mohs' hardness of the shielding structure is approximately smaller than 4.

19. The OEL panel according to claim 13, wherein the thickness of the shielding structure approximately ranges between 0.2μm and 100μm.

20. The OEL panel according to claim 19, wherein the thickness of the shielding structure is approximately equal to 5μm.

21. The OEL panel according to claim 13, wherein the shielding structure comprises a first shielding layer having a Mohs' hardness approximately smaller than 4 and a second shielding layer, and the first shielding layer is positioned between the second shielding layer and the second electrode.

22. The OEL panel according to claim 21, wherein the first shielding layer is comprised of an organic material or an inorganic material.

23. The OEL panel according to claim 21, wherein the second electrode is comprised of indium tin oxide (ITO), and the material of the first shielding layer includes aluminum.

24. The OEL panel according to claim 21, wherein the material of the first shielding layer includes copper phthalocyanine (CuPC), 8-tris-hydroquinoline-aluminum ($Alq_3$) or triphenylamine derivative (TPD), and the material of the second shielding layer includes aluminum.

* * * * *